(12) United States Patent
Park et al.

(10) Patent No.: US 11,048,307 B2
(45) Date of Patent: Jun. 29, 2021

(54) DUAL CAMERA MODULE AND PORTABLE ELECTRONIC DEVICE

(71) Applicant: Samsung Electro-Mechanics Co., Ltd., Suwon-si (KR)

(72) Inventors: Won Ki Park, Suwon-si (KR); Jong Woo Kim, Suwon-si (KR); Jong Yong Park, Suwon-si (KR); Seok Jo Hwang, Suwon-si (KR); Ick Chan Shim, Suwon-si (KR); Dae Hyun Jeong, Suwon-si (KR); Byung Gi An, Suwon-si (KR); Dae Wook Kim, Suwon-si (KR); Kyung Hoon Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/364,349

(22) Filed: Mar. 26, 2019

(65) Prior Publication Data

US 2019/0369678 A1  Dec. 5, 2019

(30) Foreign Application Priority Data

Jun. 1, 2018 (KR) .................. 10-2018-0063715
Aug. 9, 2018 (KR) .................. 10-2018-0093063

(51) Int. Cl.
G06F 1/16 (2006.01)
H05K 1/02 (2006.01)
H04N 5/225 (2006.01)

(52) U.S. Cl.
CPC ......... *G06F 1/1686* (2013.01); *H04N 5/2252* (2013.01); *H04N 5/2253* (2013.01); *H04N 5/2254* (2013.01); *H05K 1/0274* (2013.01)

(58) Field of Classification Search
CPC .. H05K 1/0274; H04N 5/2253; H04N 5/2254; H04N 5/2258; H04M 1/0264
See application file for complete search history.

(56) References Cited

U.S. PATENT DOCUMENTS 10,761,292 B2   9/2020  O et al.
2016/0173757 A1  6/2016  Choi
(Continued)

FOREIGN PATENT DOCUMENTS

CN  106937032 A  7/2017
CN  107102498 A  8/2017
(Continued)

OTHER PUBLICATIONS

Korean Office Action dated Feb. 10, 2020 in counterpart Korean Patent Application No. 10-2018-0093063 (8 pages in English and 6 pages in Korean).
(Continued)

*Primary Examiner* — Gevell V Selby
(74) *Attorney, Agent, or Firm* — NSIP Law

(57) ABSTRACT

A dual camera module includes a single housing accommodating a plurality of lens modules, a first actuator configured to move one of the plurality of lens modules in an optical axis direction, and a plurality of printed circuit boards attached to a lower portion of the single housing. One printed circuit board corresponding to a lens module moved by the first actuator, among the plurality of printed circuit boards, is disposed to be lower than the other printed circuit boards in the optical axis direction.

17 Claims, 5 Drawing Sheets

(56) References Cited

U.S. PATENT DOCUMENTS

| | | | |
|---|---|---|---|
| 2017/0082823 A1* | 3/2017 | Hwang | H04N 5/23248 |
| 2017/0134628 A1 | 5/2017 | Hwang et al. | |
| 2018/0067379 A1 | 3/2018 | Rho et al. | |
| 2018/0196219 A1* | 7/2018 | O | H04N 5/2253 |
| 2018/0234529 A1* | 8/2018 | Yu | H04N 5/2258 |
| 2018/0367720 A1* | 12/2018 | Lu | H04N 5/2258 |
| 2020/0021720 A1* | 1/2020 | Wang | H04N 5/2258 |

FOREIGN PATENT DOCUMENTS

| | | |
|---|---|---|
| CN | 107155041 A | 9/2017 |
| CN | 107181903 A | 9/2017 |
| CN | 107820576 A | 3/2018 |
| JP | 2005-31466 A | 2/2005 |
| JP | 2016-114946 A | 6/2016 |
| KR | 10-2017-0052977 A | 5/2017 |
| KR | 10-1783773 B1 | 10/2017 |
| KR | 10-2018-0027977 A | 3/2018 |
| KR | 10-2018-0092131 A | 8/2018 |

OTHER PUBLICATIONS

Chinese Office Action dated Sep. 7, 2020 in counterpart Chinese Patent Application No. 201910424559.X (7 pages in English and 9 pages in Chinese).

\* cited by examiner the benefit under 35 U.S.C. § 119(a) of Korean Patent Application No. 10-2018-0063715 filed on Jun. 1, 2018, and Korean Patent Application No. 10-2018-0093063 filed on Aug. 9, 2018, the entire disclosures of which are incorporated herein by reference for all purposes.
DUAL CAMERA MODULE AND PORTABLE ELECTRONIC DEVICE

CROSS-REFERENCE TO RELATED APPLICATIONS

This application claims

BACKGROUND

1. Field

The following description relates to a dual camera module and a portable electronic device.

2. Description of the Background

Camera modules have been used in mobile communications terminals such as smartphones, tablet PCs, notebook computers, and the like.

In recent years, a dual camera having two lens modules has been provided. Such a dual camera has been designed in a form in which two independent camera modules are simply disposed in parallel.

Such a form may be vulnerable to post-warpage or the like, and thus requires additional reinforcement through a stiffener.

In addition, since two independent camera modules are simply disposed in parallel, there is a possibility that an optical axis of each camera module may be warped during an assembling process, and there may be a limit in reducing an overall size of the dual camera.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a dual camera module includes a single housing accommodating a plurality of lens modules, a first actuator configured to move one of the plurality of lens modules in an optical axis direction, and a plurality of printed circuit boards attached to a lower portion of the single housing. One printed circuit board corresponding to a lens module moved by the first actuator, among the plurality of printed circuit boards, is disposed to be lower than the other printed circuit boards in the optical axis direction.

A step portion may be disposed on a lower portion of the single housing.

A lower surface of the single housing may have a height difference with respect to the step portion.

Attachment positions of the plurality of printed circuit boards to the single housing may be different from each other in the optical axis direction.

The plurality of lens modules may have different angles of view and different total track lengths.

One of the plurality of lens modules may be movable in the optical axis direction to enable focus adjustment, and the other lens modules may be fixed focus lens modules fixed relative to the single housing.

The single housing may have a first step portion disposed on an upper portion and a second step portion disposed on a lower portion of the single housing.

A portable electronic device may include the dual camera module which may further include a plurality of image sensors disposed on respective ones of the plurality of circuit boards, configured to convert light incident through respective ones of the plurality of lens modules to an electric signal, and a display unit disposed on a surface of the portable electronic device to display an image based on the electric signal.

In another general aspect, a dual camera module includes a single housing accommodating a first lens module and a second lens module, and a first image sensor module and a second image sensor module attached to a lower portion of the single housing. The first lens module is configured to be movable in an optical axis direction, and the second lens module is fixed relative to the single housing, and a position of the first image sensor module in the optical axis direction is different from a position of the second image sensor module in the optical axis direction.

The first image sensor module may include a first image sensor and a first printed circuit board corresponding to the first lens module, the second image sensor module may include a second image sensor and a second printed circuit board corresponding to the second lens module, and the first printed circuit board may be disposed to be lower than the second printed circuit board in the optical axis direction.

At least one of an upper portion and a lower portion of the single housing includes a step portion disposed thereon.

The single housing may include a base having two optical path windows and a case coupled to the base.

At least one of a lower portion of the base and an upper portion of the case may include a step portion disposed thereon.

A portable electronic device may include the dual camera module wherein the first image sensor module may have a first image sensor configured to convert light incident through the first lens module to an electric signal and the second image sensor module may have a second image sensor configured to convert light incident through the second lens module to an electric signal, and a display unit disposed on a surface of the portable electronic device to display an image based on the electric signal.

In another general aspect, a portable electronic device includes first and second through holes of substantially the same size, a single housing accommodating a first lens module exposed through the first through hole and a second lens module exposed through the second through hole, and a first image sensor and a second image sensor attached to a lower portion of the single housing configured to convert light incident through the first and second lens modules to an electric signal, wherein the first lens module and the second lens module comprise different angles of view from each other, different total track lengths from each other, or both different angles of view and different total track lengths from each other.

A first step portion may be disposed on an upper portion of the single housing, a second step portion may be disposed on a lower portion of the single housing, or both a first step portion may be disposed on an upper portion of the single housing and a second step portion may be disposed on a lower portion of the single housing.

The first image sensor may be disposed on a first printed circuit board corresponding to the first lens module, the second image sensor may be disposed on a second printed circuit board corresponding to the second lens module, and the first printed circuit board may be disposed to be lower than the second printed circuit board in an optical axis direction.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
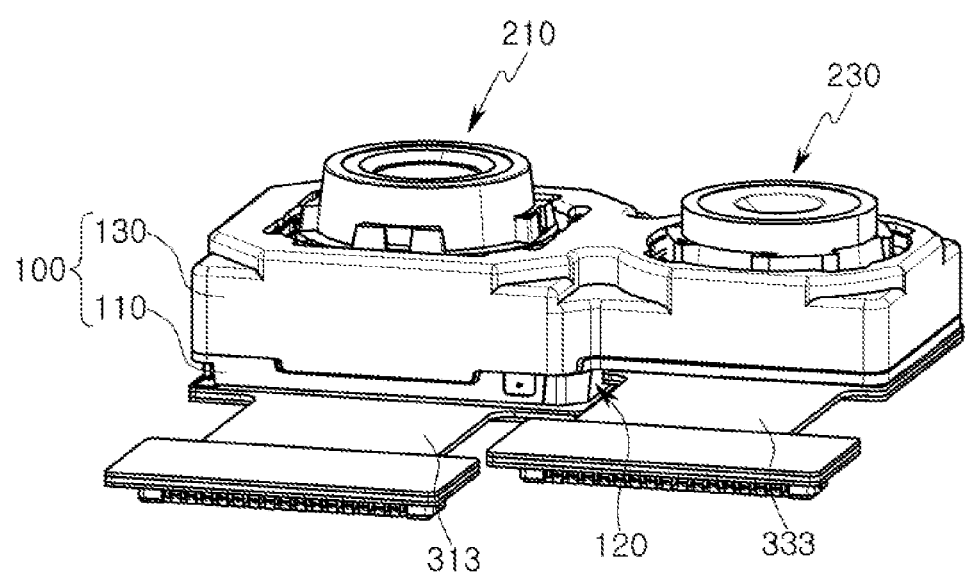
FIG. 1 is a perspective view illustrating an example of a dual camera module according to a first embodiment in the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining an understanding of the disclosure of this application. For example, the sequences of operations described herein are merely examples, and are not limited to those set forth herein, but may be changed, as will be apparent after gaining an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have merely been provided to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. As used herein, the term "and/or" includes any one and any combination of any two or more of the associated listed items; likewise, "at least one of" includes any one and any combination of any two or more of the associated listed items. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The use of the term "may" with respect to an example or embodiment, for example, as to what an example or embodiment may include or implement, means that at least one example or embodiment exists in which such a feature is included or implemented while all examples and embodiments are not limited thereto.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower," relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The features of the examples described herein may be combined in various ways as will be apparent after an understanding of the disclosure of this application. Further, although the examples described herein have a variety of configurations, other configurations are possible as will be apparent after an understanding of the disclosure of this application.

Due to manufacturing techniques and/or tolerances, variations of the shapes shown in the drawings may occur. Thus, the examples described herein are not limited to the specific shapes shown in the drawings, but include changes in shape that occur during manufacturing.

An aspect of the present disclosure is to provide a dual camera module, of which the size may be reduced, while employing a plurality of lens modules, and in which optical axes of the plurality of lens modules may be easily aligned.

A dual camera module according to an example is described herein, and may be applied to portable electronic devices such as a mobile communications terminal, a smartphone, a tablet PC, and the like. The dual camera module may be a portable electronic device.

Figure 2:
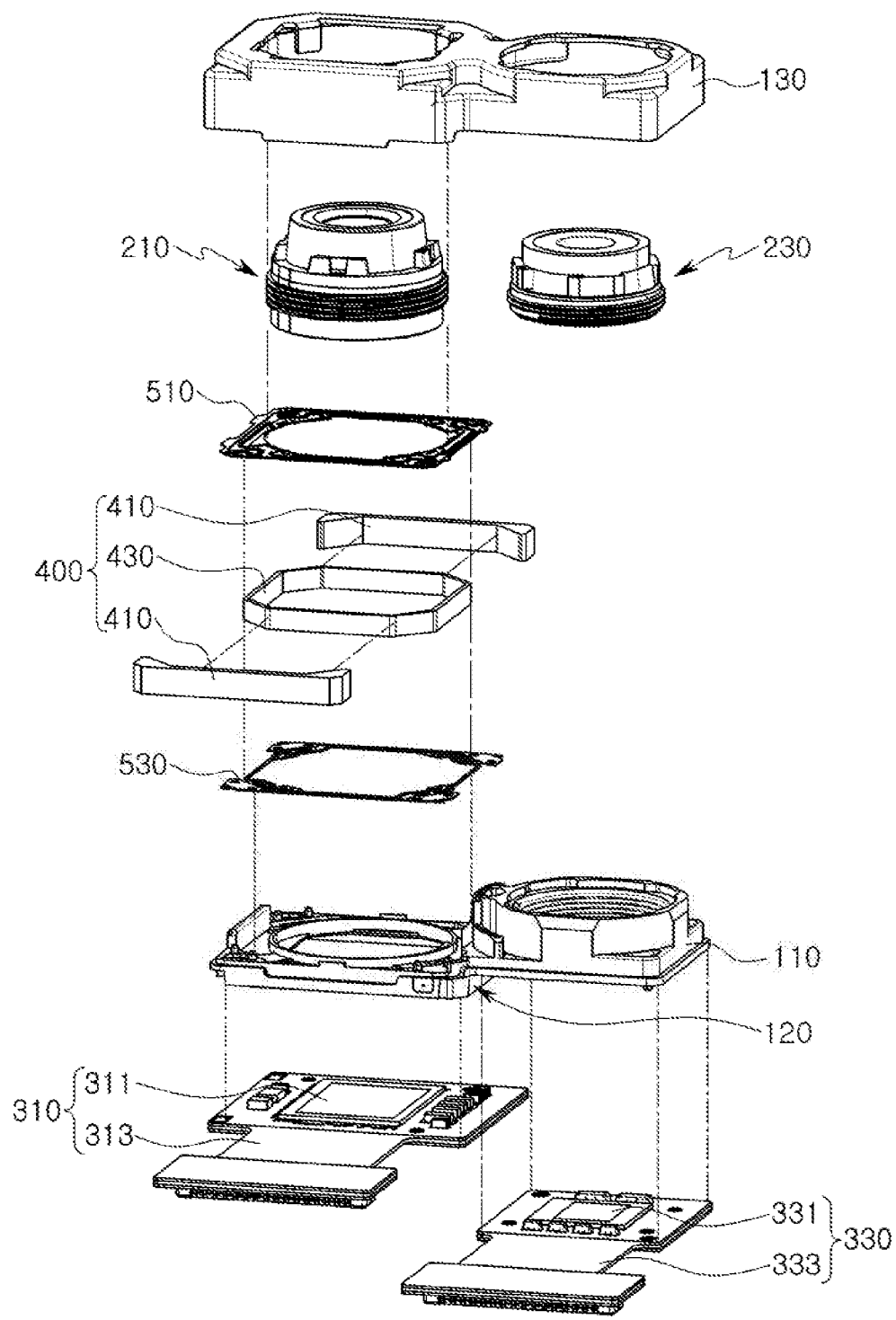
FIG. 2 is a partially exploded perspective view of the dual camera module according to the first embodiment.

FIG. 1 is a perspective view illustrating an example of a dual camera module according to a first embodiment in the present disclosure. FIG. 2 is a partially exploded perspective view of the example dual camera module according to the first embodiment.

Referring to FIGS. 1 and 2, an example dual camera module according to the first embodiment includes a plurality of lens modules 210 and 230, a single housing 100 accommodating a plurality of lens modules 210 and 230, and a plurality of image sensor modules converting light incident through the plurality of lens modules 210 and 230 into electric signals, respectively.

The plurality of lens modules 210 and 230 indicate that two or more lens modules are provided. In this embodiment, two lens modules, for example, a first lens module 210 and a second lens module 230, will be described, but the number of lens modules does not limit the scope of the present disclosure.

The first lens module 210 and the second lens module 230 each include a lens barrel, each lens barrel may be substantially cylindrical, and a plurality of lenses capturing an image of an object may be accommodated inside thereof along an optical axis.

At least one of the first lens module 210 and the second lens module 230 is accommodated in the housing 100 to be movable in at least one of an optical axis direction and a direction perpendicular to the optical axis direction.

The first lens module 210 and the second lens module 230 may be configured to have different angles of view.

For example, an angle of view of one of the first lens module 210 and the second lens module 230 may be relatively wide as in a wide angle lens, and the other angle of view may be relatively narrow as in a telephoto lens.

By designing the two lens modules with different angles of view, an image of the object may be captured at various depths.

In addition, since two images of one object, for example, a synthesized image thereof, may be used to generate a high-resolution image or a bright image, an image of the object may be clearly captured in a low-light environment.

In addition, a 3D image may be implemented using a plurality of images, and a zoom function may also be implemented.

In this embodiment, a housing accommodating the first lens module 210 and a housing accommodating the second lens module 230 are integrally formed. For example, the housing accommodating the first lens module 210 and the housing accommodating the second lens module 230 are provided as a single housing 100 (hereinafter referred to as a housing 100), rather than separated housings.

The housing 100 includes a base 110, and a case 130 coupled to the base 110.

The housing 100 has two accommodating spaces, accommodating the first lens module 210 and the second lens module 230, respectively.

The base 110 is provided with two optical path windows. Thus, light having passed through the first lens module 210 and the second lens module 230 through the two optical path windows may be received by the first and second image sensors 311 and 331.

The case 130 is coupled to the base 110, and functions to protect internal components of the dual camera module.

In the housing 100, a step portion 120 is formed on at least one of an upper part and a lower part thereof. The step portion 120 may be formed on at least one of the base 110 and the case 130.

In this embodiment, a plurality of image sensor modules are provided to correspond to the plurality of lens modules 210 and 230, respectively. The plurality of image sensor modules include a first image sensor module 310 converting light passing through the first lens module 210 into an electric signal, and a second image sensor module 330 converting light passing through the second lens module 230 into an electric signal as shown in FIG. 2.

The first image sensor module 310 and the second image sensor module 330 are respectively attached to the housing 100.

The first image sensor module 310 includes a first printed circuit board 313 attached to the base 110, and a first image sensor 311 connected to the first printed circuit board 313.

The second image sensor module 330 includes a second printed circuit board 333 attached to the base 110, and a second image sensor 331 connected to the second printed circuit board 333.

In addition, the first and second image sensor modules 310 and 330 may each further include an infrared filter. The infrared filter functions to block light in an infrared region, in light incident through the lens modules 210 and 230.

The first and second image sensors 311 and 331 convert light incident through the first and second lens modules 210 and 230 into electric signals. For example, the first and second image sensors 311 and 331 may be a charge coupled device (CCD) or a complementary metal-oxide semiconductor (CMOS).

At least one of the first lens module 210 and the second lens module 230 may be moved in an optical axis direction for focus adjustment. For example, the first lens module 210 may be a lens module moved in the optical axis direction to adjust a focus, and the second lens module 230 may be a fixed focus lens module fixed to the housing 100.

To this end, a first actuator 400 may be further provided in the example dual camera module according to the first embodiment.

The first actuator 400 includes a magnet 410 and a coil 430. The magnet 410 may be provided in the housing 100, and the coil 430 may be provided in the first lens module 210.

In an example, the magnet may be provided as two magnets 410 facing each other, and the two magnets 410 may be fixed to the housing 100. In addition, the coil 430 may be provided as a winding coil wound on an outer surface of a lens barrel of the first lens module 210.

Thus, the magnets 410 and the coil 430 may be disposed to face each other in a direction perpendicular to the optical axis direction.

When power is applied to the coil 430, the first lens module 210 may be moved in the optical axis direction by an influence of electromagnetic force between the magnets 410 and the coil 430.

On the other hand, an elastic member may be provided to support the first lens module 210. In an example, the elastic member may include a first elastic member 510 disposed on an upper portion of the first lens module 210, and a second elastic member 530 disposed below the first lens module 210.

Thus, the first lens module 210 may be moved in the optical axis direction by driving force of the first actuator 400 while being supported by the elastic member.

At least one of the first lens module 210 and the second lens module 230 may be moved in a direction perpendicular to the optical axis direction for shake correction.

To this end, the example dual camera module according to the first embodiment may further be provided with a second actuator (not shown). The second actuator includes a plurality of magnets and a plurality of coils. In a case in which power is applied to the plurality of coils, the second actuator generates driving force in a direction perpendicular to the optical axis direction by an influence of electromagnetic force between the plurality of magnets and the plurality of coils.

For example, at least one of the first lens module 210 and the second lens module 230 is moved in the optical axis direction by the first actuator to adjust a focus, and is moved in the direction perpendicular to the optical axis direction by the second actuator to correct shake at the time of capturing an image.

Figure 3:
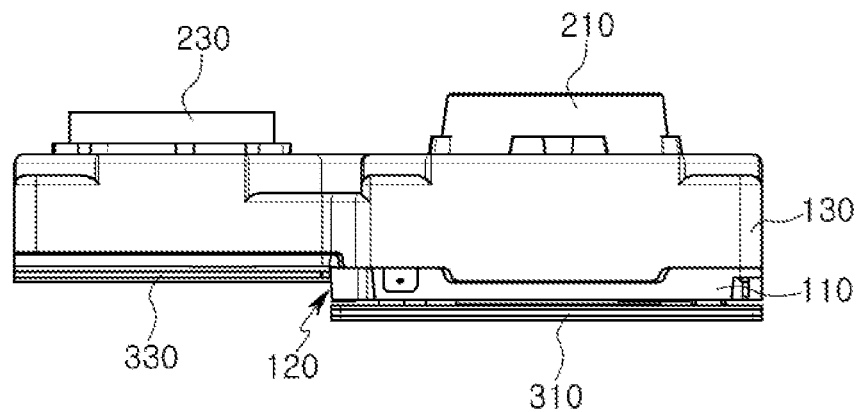
FIG. 3 is a side view of the dual camera module according to the first embodiment.

FIG. 3 is a side view of the example dual camera module according to the first embodiment.

The housing 100 has two accommodating spaces accommodating the first lens module 210 and the second lens module 230, respectively.

Unlike the present disclosure, if a dual camera module in which two independent cameras are simply combined is used, a separate bracket for structurally combining two independent cameras is additionally required. Thus, there is a limit in reducing an overall size of the dual camera module.

However, in the case of the example dual camera module according to the first embodiment of the present disclosure, a separate bracket is not required, and an overall size of the dual camera module may be reduced by disposing the first and second lens modules 210 and 230 in the housing 100 having two accommodating spaces. Further, reliability against external shocks and the like may be improved.

On the other hand, the example dual camera module according to an example of the present disclosure may be mounted in a portable electronic device. In this case, a plurality of through holes 1010 and 1030 (FIG. 7) are provided in the portable electronic device 1000, in such a manner that light may be incident on a plurality of lens modules of the dual camera module therethrough. For example, the through holes may be in a cover of a portable electronic device.

The plurality of lens modules provided in the dual camera module may have different angles of view and total track lengths. In this case, the total track length (TTL) may indicate a distance from an object-side surface of a lens closest to an object to an image sensor.

In the case in which the angles of view and the total track lengths of the plurality of lens modules are different as described above, the size of the plurality of through holes provided in the portable electronic device should be changed depending on an angle of view and a total track length of a lens module corresponding thereto.

However, in the example dual camera module according to the first embodiment of the present disclosure, although the first and second lens modules 210 and 230 have different angles of view and total track lengths, there is no need that a plurality of through holes 1010 and 1030 of a portable electronic device 1000 in which a dual camera module is mounted have different sizes.

Thus, the degree of freedom in mounting the dual camera module in the portable electronic device may be increased.

To this end, the step portion 120 is formed in a lower portion of the housing 100 of the example dual camera module according to the first embodiment of the present disclosure.

The step portion 120 may indicate a difference in height between a lower portion (for example, a lower portion of the base 110) of the housing 100 in which the first lens module 210 is mounted and a lower portion (for example, a lower portion of the base 110) of the housing 100 in which the second lens module 230 is mounted.

For example, when the step portion 120 is formed on an upper portion of the housing 100, for example, an upper portion of the case 130, the step portion 120 may indicate a portion having a height difference between an upper portion of the housing 100 in which the first lens module 210 is mounted, for example, an upper portion of the case 130, and an upper portion of the housing 100 on which the second lens module 230 is mounted, for example, an upper portion of the case 130.

For example, at least one of an upper surface and a lower surface of the housing 100 may have a height difference with respect to the step portion 120.

Thus, a position of the first image sensor module 310 in the optical axis direction is different from a position of the second image sensor module 330 in the optical axis direction.

An attachment position of the first printed circuit board 313 corresponding to the first lens module 210 and an attachment position of the second printed circuit board 333 corresponding to the second lens module 230 attached to the housing 100 in the optical axis direction are different from each other.

For example, the first printed circuit board 313 may be disposed to be lower than the second printed circuit board 333 in the optical axis direction.

The first lens module 210 and the second lens module 230 may have different angles of view and may have different total track lengths.

For example, by forming the step portion 120 on the housing 100, positions in which the first and second lens modules 210 and 230 are coupled to the housing 100 may be determined depending on angles of view and total track lengths of the first and second lens modules 210 and 230. As a result, the sizes of the plurality of through holes 1010 and 1030 provided in the portable electronic device 1000 may not be different, for example, may be substantially the same, even when the first and second lens modules 210 and 230 have different angles of view and different total track lengths.

On the other hand, in the example dual camera module according to the first embodiment of the present disclosure, two image sensor modules 310 and 330 are mounted on a lower portion of the housing 100.

For example, on a lower portion of the housing 100, a first image sensor module 310 converting light having passed through the first lens module 210 into an electric signal, and a second image sensor module 330 converting light having passed through the second lens module 230 into an electrical signal, are mounted.

The first image sensor module 310 includes the first printed circuit board 313 attached to the base 110, and the first image sensor 311 connected to the first printed circuit board 313.

The second image sensor module 330 includes the second printed circuit board 333 attached to the base 110, and the second image sensor 331 connected to the second printed circuit board 333.

For example, in the example dual camera module according to the first embodiment, the first and second lens modules 210 and 230 are accommodated in the housing 100, and a separate image sensor module corresponding to each lens module is mounted on a lower portion of the housing 100.

By separating the image sensor modules respectively corresponding to lens modules, an optical axis for each lens module may be easily aligned in an assembling process of the dual camera modules.

Unlike in the present disclosure, in a case in which one image sensor module is mounted on a dual camera, there is a fear that an optical axis of each lens module may be twisted in a process of attaching an image sensor module to a housing.

In this case, for example, in a position in which a plurality of lens modules are adjacent to each other, a mounting space may be relatively narrow such that it may be difficult to cure an adhesive. Thus, there may be a fear that an attachment position may be changed during a process of attaching an image sensor module to a housing.

However, in the example dual camera module according to the first embodiment of the present disclosure, since the first image sensor module 310 and the second image sensor module 330, are separated from each other and attached to the lower portion of the housing 100, the optical axis of each of the lens modules 210 and 230 may be easily aligned.

Figure 4:
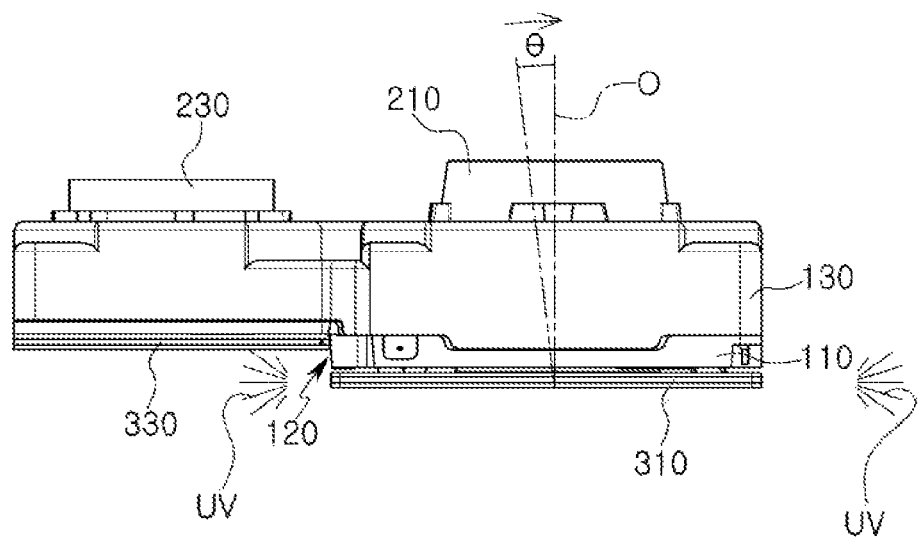
FIG. 4 is a schematic view illustrating a process of aligning an optical axis of a lens module in the dual camera module according to the first embodiment.

An example method of aligning an optical axis of the first lens module 210 in the process of attaching the first image sensor module 310 will be described with reference to FIG. 4.

First, the housing 100 and the first printed circuit board 313 are adhered to each other through provision curing.

A resolution of an image captured by the first lens module 210 and the first image sensor module 310 is inspected so that an optical axis O of the first lens module 210 may be aligned with respect to the first image sensor 311.

The optical axis O of the first lens module 210 should be positioned perpendicular to the first image sensor 311, but may be tilted by a predetermined angle (θ) due to various unintended factors.

In this case, since the resolution is determined to be defective, relative positions of the housing 100 and the first image sensor module 310 are adjusted into a position in which the optical axis O of the first lens module 210 is aligned with respect to the first image sensor 311, for example, is vertically positioned. The adjustment of the relative position may be performed in a process of adjusting a tilt angle between the first image sensor module 310 and the housing 100.

The first image sensor module 310 cured provisionally, is completely cured with respect to the housing 100 by ultraviolet light irradiated between the housing 100 and the first image sensor module 310.

In this example case, since the step portion 120 is provided on the lower portion of the housing 100, a sufficient space to irradiate ultraviolet rays for adhesive hardening may be provided irrespective of the second image sensor module 330.

However, if there is no step portion 120 on the lower portion of the housing 100, since the space for irradiating ultraviolet rays is relatively narrow, the process of hardening an adhesive after the optical axis O of the first lens module 210 is aligned may not be performed. Accordingly, there is a fear that the attachment position may be changed during the process of attaching the first image sensor module 310 to the housing 100.

Figure 5:
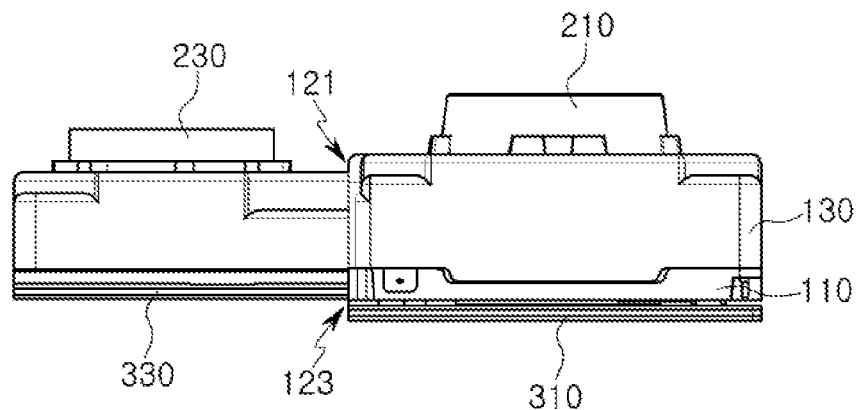
FIG. 5 is a side view of an example dual camera module according to a second embodiment in the present disclosure.
Figure 6:
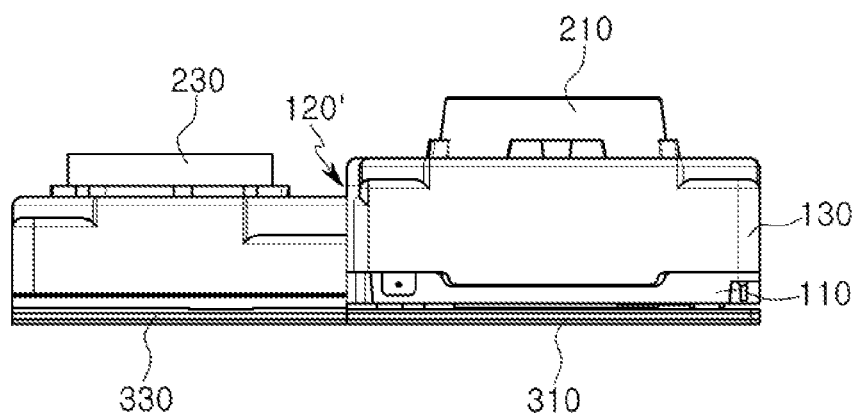
FIG. 6 is a side view of an example dual camera module according to a third embodiment in the present disclosure.

FIG. 5 is a side view of an example dual camera module according to a second embodiment of the present disclosure, and FIG. 6 is a side view of an example dual camera module according to a third embodiment of the present disclosure.

Referring to FIGS. 5 and 6, since the second and third embodiments are different from the first embodiment described above, in terms of the position of the step portion formed on the housing, further descriptions other than a description of the position of a step portion formed on the housing may be omitted.

Referring to FIG. 5, a first step portion 121 is formed on an upper portion of the housing 100, and a second step portion 123 is formed on a lower portion of the housing 100.

The first step portion 121 has a height difference between an upper portion of the case 130 in which the first lens module 210 is provided and an upper portion of the case 130 in which the second lens module 230 is provided.

The second step portion 123 has a height difference between a lower portion of the base 110 in which the first lens module 210 is provided and a lower portion of the base 110 in which the second lens module 230 is provided.

By forming the first step portion 121 and the second step portion 123 on the housing 100 as described above, positions in which respective lens modules are coupled to the housing 100 may be determined depending on angles of view and total track lengths of the first and second lens modules 210 and 230. As a result, the sizes of a plurality of through holes provided in a portable electronic device may not be different, for example, may be substantially the same, even when the first lens module 210 and the second lens module 230 have different angles of view and different total track lengths.

Referring to FIG. 6, a step portion 120' is formed on an upper portion of the housing 100. The step portion 120' has a height difference between an upper portion of the case 130 in which the first lens module 210 is provided and an upper portion of the case 130 in which the second lens module 230 is provided.

By forming the step portion 120' on the housing 100 as described above, positions in which respective lens modules are coupled to the housing 100 may be determined depending on angles of view and total track lengths of the first and second lens modules 210 and 230. As a result, the sizes of a plurality of through holes provided in a portable electronic device may not be different, for example, may be substantially the same, even when the first lens module 210 and the second lens module 230 have different angles of view and different total track lengths.

Figure 7:
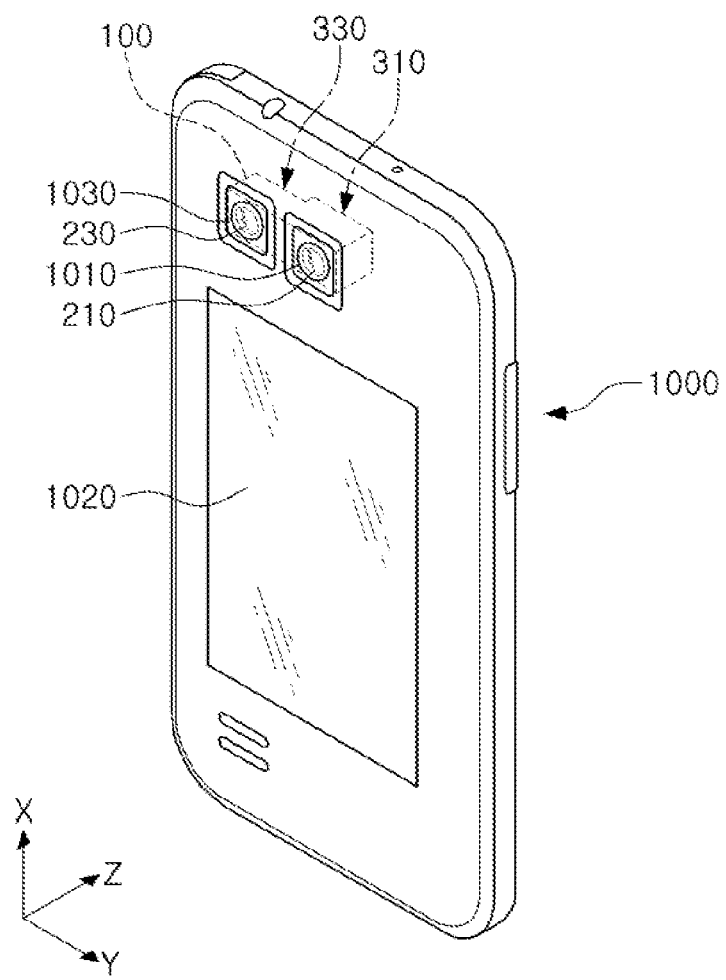
FIG. 7 is a perspective view illustrating one or more examples of a portable electronic device dual camera module.

Referring to FIG. 7, the example dual camera module according to the examples described herein, may be a mobile device, such as a portable electronic device 1000, and further include a display unit 1020, wherein the dual camera module is installed as a front camera of the portable electronic device 1000 along with the display unit 1020 or as a back camera on a side of the portable electronic device 1000 other than a side with the display unit 1020. As described in the various examples, electric signals converted by first image sensor 311 of the first image sensor module 310 and second image sensor 331 of the second image sensor module 330 (FIG. 2) of the dual camera module may be output as an image via the display unit 1020 of the portable electronic device 1000.

The one or more examples of the dual camera module according to the various embodiments described herein may be reduced in size while employing a plurality of lens modules, and an optical axis of the plurality of lens modules may easily be aligned.

As set forth herein, in the case of a dual camera module according to one or more examples, the size thereof may be reduced while a plurality of lens modules are employed, and an optical axis of a plurality of lens modules may easily be aligned.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects of the present disclosure in each example are to be considered as being applicable to similar features or aspects of the present disclosure in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A dual camera module comprising:
a single housing accommodating a plurality of lens modules and comprising:
  a unitary base including a lower portion and a step portion formed in the lower portion; and
  a case coupled to the unitary base;
a first actuator configured to move one lens module, among the plurality of lens modules, in an optical axis direction; and
a plurality of printed circuit boards attached to the lower portion,
wherein one printed circuit board, among the plurality of printed circuit boards, corresponding to the one lens module is disposed on a first portion of a bottom surface of the lower portion,
wherein another printed circuit board, among the plurality of printed circuit boards, is disposed on a second portion of the bottom surface of the lower portion, and
wherein the first and second portions of the bottom surface of the lower portion are connected to each other by the step portion.

2. The dual camera module of claim 1, wherein a lower surface of the single housing comprises a height difference with respect to the step portion.

3. The dual camera module of claim 1, wherein attachment positions of the plurality of printed circuit boards to the unitary base are different from each other in the optical axis direction.

4. The dual camera module of claim 1, wherein the plurality of lens modules comprise different angles of view and different total track lengths.

5. The dual camera module of claim 1, wherein the one lens module is movable in the optical axis direction to enable focus adjustment, and other lens modules, among the plurality of lens modules, are fixed focus lens modules fixed relative to the single housing.

6. The dual camera module of claim 1, wherein the single housing comprises another step portion disposed on an upper portion of the single housing.

7. A portable electronic device, comprising:
the dual camera module of claim 1 further comprising a plurality of image sensors disposed on respective ones of the plurality of circuit boards, configured to convert light incident through respective ones of the plurality of lens modules to an electrical signal; and
a display unit disposed on a surface of the portable electronic device to display an image based on the electrical signal.

8. The dual camera module of claim 1, wherein the one printed circuit board is disposed lower than the other printed circuit board in the optical axis direction.

9. A dual camera module comprising:
a single housing accommodating a first lens module and a second lens module, and comprising:
  a unitary base including a lower portion and a step portion formed in the lower portion; and
  a case coupled to the unitary base;
a first printed circuit board attached to a first portion of a bottom surface of the lower portion, and supporting a first image sensor corresponding to the first lens module;
a second printed circuit board attached to a second portion of the bottom surface of the lower portion, and supporting a second image sensor corresponding to the second lens module,
wherein the first and second portions of the bottom surface of the lower portion are connected to each other by the step portion, and
wherein a position of the first printed circuit board in an optical axis direction is different from a position of the second printed circuit board in the optical axis direction.

10. The dual camera module of claim 9, wherein the first lens module is configured to be movable in the optical axis direction relative to the single housing, and the second lens module is fixed relative to the single housing, and
wherein the first printed circuit board is disposed to be lower than the second printed circuit board in the optical axis direction.

11. The dual camera module of claim 9, wherein an upper portion of the single housing comprises another step portion disposed thereon.

12. The dual camera module of claim 9, wherein the unitary base includes two optical path windows.

13. The dual camera module of claim 12, wherein an upper portion of the case comprises another step portion disposed thereon.

14. A portable electronic device, comprising:
the dual camera module of claim 9, wherein the first image sensor is configured to convert light incident through the first lens module to a first electrical signal, and the second image sensor is configured to convert light incident through the second lens module to a second electrical signal; and
a display unit disposed on a surface of the portable electronic device to display an image based on the first and second electrical signals.

15. A portable electronic device comprising:
first and second through holes of substantially the same size;
a single housing accommodating a first lens module exposed through the first through hole and a second lens module exposed through the second through hole, the single housing comprising:
  a unitary base including a lower portion and a step portion formed in the lower portion; and
  a case coupled to the unitary base;

a first image sensor disposed on a first printed circuit board attached to a first portion of a bottom surface of the lower portion, the first image sensor being configured to convert light incident through the first lens module to a first electrical signal; and a second image sensor disposed on a second printed circuit board attached to a second portion of the bottom surface of the lower portion, and the second image sensor being configured to convert light incident through the second lens module to a second electrical signal, wherein the first and second portions of the bottom surface of the lower portion are connected to each other by the step portion, and wherein the first lens module and the second lens module comprise different angles of view from each other, different total track lengths from each other, or both different angles of view and different total track lengths from each other.

16. The portable electronic device of claim 15, wherein another step portion is disposed on an upper portion of the single housing.

17. The portable electronic device of claim 15, wherein the first printed circuit board is disposed lower than the second printed circuit board in an optical axis direction.

* * * * *